United States Patent [19]

Kaplan et al.

[11] 4,151,058

[45] Apr. 24, 1979

[54] METHOD FOR MANUFACTURING A LAYER OF AMORPHOUS SILICON USABLE IN AN ELECTRONIC DEVICE

[75] Inventors: Daniel Kaplan; Gonzalo Velasco, both of Paris, France

[73] Assignee: Thomson-CSF, Paris, France

[21] Appl. No.: 912,533

[22] Filed: Jun. 5, 1978

[30] Foreign Application Priority Data

Jun. 6, 1977 [FR] France ............... 77 17245

[51] Int. Cl.² ............................................. C23C 15/00
[52] U.S. Cl. .................................. 204/192 S; 427/38; 427/39; 427/86; 357/2
[58] Field of Search ................ 204/192 S; 427/38, 39, 427/86; 357/2

[56] References Cited

U.S. PATENT DOCUMENTS

| 3,463,715 | 8/1969 | Bloom ............................. 204/192 S |
| 3,501,336 | 3/1970 | Dyer ..................................... 427/86 |
| 4,064,521 | 12/1977 | Carlson ................................. 427/39 |

OTHER PUBLICATIONS

IBM Technical Disclosure Bulletin, vol. 19, No. 12, May 1977, Brodsky et al., Doping of Sputtered Amorphous Semiconductors.

Comber et al., Electronic Transport and State Distribution in Amorphous SI Films, J. of Non-Crystalline Solids, 11/1972, pp. 219-234.

Primary Examiner—John H. Mack
Assistant Examiner—William Leader
Attorney, Agent, or Firm—Oblon, Fisher, Spivak, McClelland & Maier

[57] ABSTRACT

A method aiming at imparting to the amorphous silicon properties which are compatible with the possibility of modifying by doping or field effect the position of the Fermi level in the volume of the amorphous silicon, a prime requirement for the operation of semiconductor devices. The method comprises a first step of depositing a layer of amorphous silicon onto a substrate under conditions ensuring the purity of the deposit obtained, then a second step wherein the deposit is subjected to a heat treatment consisting in maintaining the deposit in the atmosphere of a plasma containing atomic hydrogen for saturating the existing broken chemical bonds responsible for a parasitic electric conductivity.

5 Claims, 1 Drawing Figure

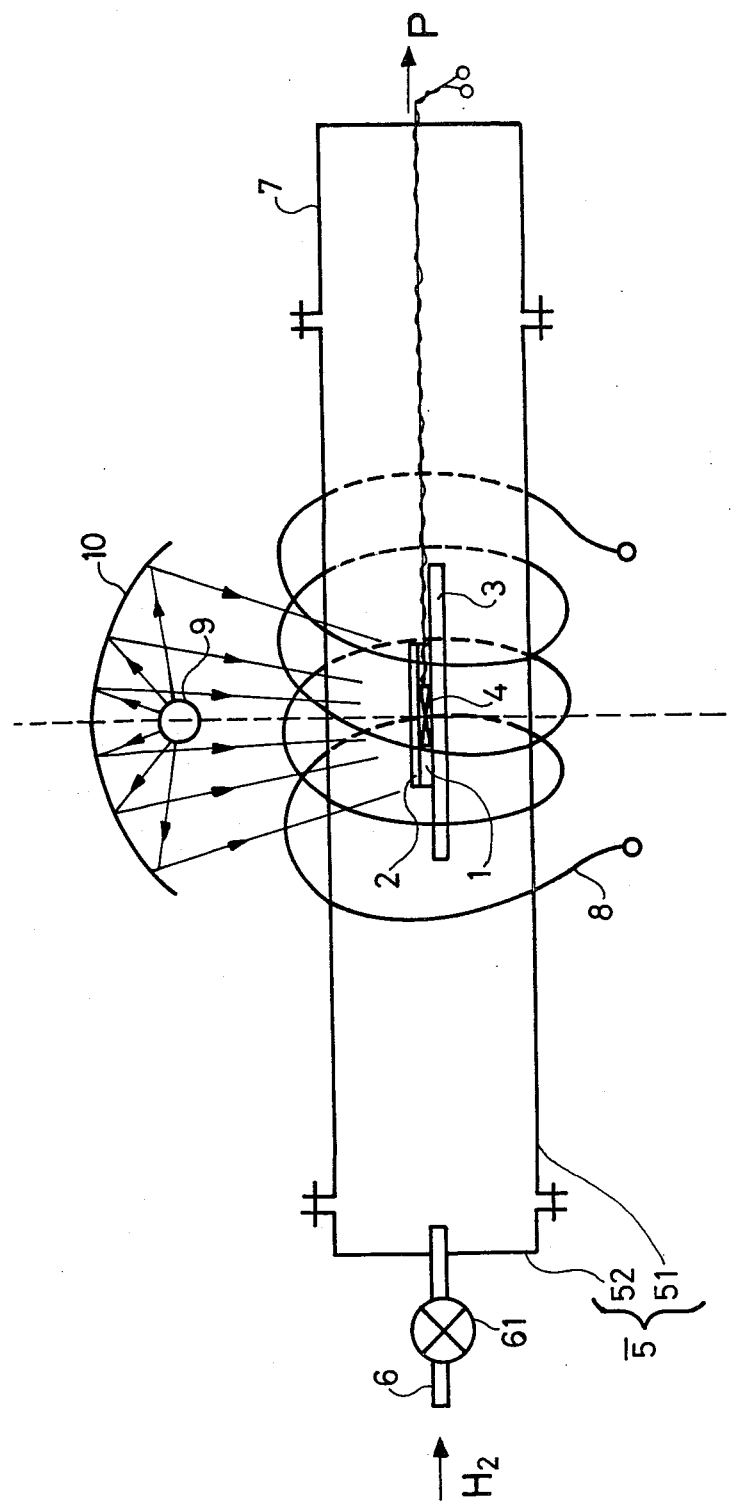

METHOD FOR MANUFACTURING A LAYER OF AMORPHOUS SILICON USABLE IN AN ELECTRONIC DEVICE

To construct semiconductor electronic devices on large surface areas, for example 100 cm$^2$, the techniques employing monocrystalline materials are inapplicable. It is known that amorphous silicon is a material which may be deposited in a layer over a large surface area and permits the production of devices such as solar batteries. It has over polycrystalline silicon deposited in a layer the advantage among others of not having grain joints which are known to deteriorate the characteristics of the devices.

In order that amorphous silicon be utilizable for devices certain conditions must be satisfied. In particular, the techniques of deposition in a vacuum such as spraying and evaporation generally result in a material having many broken chemical bonds ($10^{19}$ to $10^{20}$ per cm$^3$). These bonds introduce a parasitic electric conductivity and prevent the modification, by doping or field effect, of the position of the position of the Fermi level which is a prime requirement for the operation of most of the devices.

Two techniques have been proposed for obtaining amorphous silicon devoid of broken bonds.

First Technique

The procedure is to decompose silane with the feature that this decomposition is carried out at a low temperature (lower than 600° C.) in the presence of a high-frequency electric field ionizing the gas.

Second Technique

The method of the cathodic sputtering of a silicon target in a reactive hydrogen atmosphere is employed.

The two aforementioned techniques introduce a large amount of hydrogen in the material (10 to 30% of the number of silicon atoms according to the authors). As this amount of hydrogen is difficult to control and it affects the electrical properties of the material, considerable difficulties are encountered in the obtainment of a homogeneous material on large surfaces.

The object of the invention aims at overcoming as far as possible the aforementioned drawbacks.

According to the invention, there is provided a method for manufacturing a layer of high resistivity amorphous silicon onto a substrate, said method comprising at least the following steps:

(a) depositing under vacuum a layer of amorphous silicon onto said substrate;

(b) treating said layer at a temperature between 100° C. and the temperature of crystallization of the amorphous silicon in an atmosphere of a plasma containing hydrogen or one of its isotopes.

The invention will be better understood and other features will appear from the ensuing description and the accompanying drawing.

The single FIGURE illustrates diagramatically an assembly of means for heat treating amorphous silicon in an atmosphere of a hydrogen plasma.

Step (a) is carried out under conditions ensuring the purity of the deposit obtained that is to say by evaporation under vacuum or cathodic sputtering without hydrogen. The plasma of step (b) plays a fundamental role to have hydrogen in the atomic form which facilitates its insertion in the material. The treatment must be carried out at a temperature high enough (substrate temperature between 100°–400° C.) to permit the diffusion of the hydrogen but low enough to avoid a crystallization of the amorphous silicon (500° C. to 600° C.). The majority of the hydrogen atoms will saturate the existing broken bonds, which requires about 0.1% of the number of silicon atoms, namely much less than in the aforementioned known techniques.

The means shown in the single FIGURE comprise:

a plate 3 of molybdenum or fused silica which is used as a support for a substrate 1 carrying a layer 2 of amorphous silicon;

a thermocouple 4 which is disposed on the support 3 in the immediate vicinity of the layer 2; it is intended to check the temperature during the treatment;

an enclosure 5 formed, for example, by a tube 51 of fused silica closed at one end by an end member 52 through which a tube 6 of smaller diameter than the tube 51 extends; this tube is for circulating a current of hydrogen in the enclosure; it is provided with a valve 61; disposed at the other end of this tube 51 is a pipe 7 for connection to a vacuum pump;

means for creating a vacuum in the enclosure 5 comprising a vacuum pump symbolically represented by an arrow P; these means are capable of maintaining the pressure of hydrogen in the range of 0.01 to 1 torr for a flow of a fraction of a liter per minute;

a winding 8 of conductive wire supplied with high-frequency (10 to 100 MH$_z$) electric current capable of creating a plasma in the region of the enclosure 5 in which the support 3 is placed;

a radiating heating system comprising a source 9 and a reflector 10 capable of sending a substantially uniform flux on a surface of area equal to the area of the layer of amorphous silicon to be treated.

In a typical example, the deposition of amorphous silicon is carried out previously by evaporation on a substrate 1 of fused silica maintained at 400° C. The layer 2 of amorphous silicon has a thickness of 0.5 micron. The evaporation was carried out at a very low pressure for example $1\times 10^{-9}$ Torr. The conditions are chosen to obtain a very pure amorphous silicon having the least possible amount of defects such as cavities and lack of homogeneity.

The treatment is carried in the illustrated apparatus at a temperature of 300° C. at a hydrogen pressure of 0.1 Torr for two hours. Before the treatment, the resistivity was $1\times 10^5$ Ω cm and the specimen contained more that $10^{19}$ broken bonds per cubic cm (amount determined by electronic paramagnetic resonance). After treatment, the resistivity increases to $1\times 10^8$ Ω cm. There are less than $10^{17}$ broken bonds per cu.cm. With these characteristics, the material can be used as a base for constructing electronic devices. In particular, its photoconductive character has been ascertained.

Consequently, the material may be employed for producing solar batteries.

What we claim is:

1. A method for manufacturing a layer of high resistive amorphous silicon onto a substrate, said method comprising at least the following steps:

(a) depositing under a partitial vacuum without adding hydrogen a layer of amorphous silicon onto said substrate;

(b) maintaining said layer at a temperature between 100° C. and the temperature of crystallization of the amorphous silicon in an atmosphere of a plasma containing hydrogen or one of its isotopes to increase the resistivity of said amorphous silicon.

2. A method as claimed in claim 1, wherein, at step (a), amorphous silicon is deposited by cathodic sputtering on a substrate maintained at a temperature of more than 100° C.

3. A method as claimed in claim 1, wherein, at step (b), the plasma is created by an electric field of a frequency between 10 and 100 MHz in hydrogen at a pressure between 0.01 and 1 Torr.

4. A method as claimed in claim 1, wherein, at step (b), the substrate is placed on a support made of molybdenum or fused silica and the temperature of said substrate is between 100° and 400° C.

5. A method as claimed in claim 3, wherein, at step (b), the frequency of the electric field is of 50 MHz, the pressure of hydrogen is of 0.1 Torr and the duration of the treatment is of 2 hours.

* * * * *